(12) United States Patent
Hasebe et al.

(10) Patent No.: US 7,220,461 B2
(45) Date of Patent: May 22, 2007

(54) METHOD AND APPARATUS FOR FORMING SILICON OXIDE FILM

(75) Inventors: Kazuhide Hasebe, Tokyo (JP); Atsushi Endoh, Tokyo (JP); Daisuke Suzuki, Tokyo (JP); Keisuke Suzuki, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/961,025

(22) Filed: Oct. 12, 2004

(65) Prior Publication Data
US 2005/0196533 A1    Sep. 8, 2005

(30) Foreign Application Priority Data
Oct. 14, 2003    (JP)    ............... 2003-354233

(51) Int. Cl.
*H05H 1/24*    (2006.01)
(52) U.S. Cl. ............... 427/533; 427/255.37; 427/376.2
(58) Field of Classification Search .................. None
See application file for complete search history.

(56) References Cited

U.S. PATENT DOCUMENTS

| | | | |
|---|---|---|---|
| 5,086,017 A * | 2/1992 | Lu | 438/586 |
| 6,287,988 B1 * | 9/2001 | Nagamine et al. | 438/770 |
| 6,337,289 B1 * | 1/2002 | Narwankar et al. | 438/776 |
| 6,455,417 B1 * | 9/2002 | Bao et al. | 438/637 |
| 6,699,799 B2 * | 3/2004 | Ahn et al. | 438/781 |
| 6,803,622 B2 * | 10/2004 | Matsuno et al. | 257/314 |
| 6,972,235 B2 * | 12/2005 | Yonekawa et al. | 438/296 |
| 2001/0046792 A1 * | 11/2001 | Takahashi et al. | 438/786 |
| 2002/0164429 A1 * | 11/2002 | Gaillard et al. | 427/376.2 |
| 2002/0168873 A1 * | 11/2002 | Ahn et al. | 438/781 |
| 2003/0124873 A1 * | 7/2003 | Xing et al. | 438/770 |

FOREIGN PATENT DOCUMENTS

| | | |
|---|---|---|
| JP | 2001-77105 | 3/2001 |
| JP | 2003-209063 | 7/2003 |

* cited by examiner

*Primary Examiner*—Bret Chen
(74) *Attorney, Agent, or Firm*—Oblon, Spivak, McClelland, Maier & Neustadt, P.C.

(57) ABSTRACT

A method for forming a silicon oxide film includes disposing a silicon oxide film on a surface of a target substrate, and performing a reformation process on the silicon oxide film. The reformation process is performed by annealing the silicon oxide film while exposing the silicon oxide film to oxygen radicals and hydroxyl group radicals.

11 Claims, 6 Drawing Sheets

METHOD AND APPARATUS FOR FORMING SILICON OXIDE FILM

CROSS-REFERENCE TO RELATED APPLICATIONS

This application is based upon and claims the benefit of priority from prior Japanese Patent Application No. 2003-354233, filed Oct. 14, 2003, the entire contents of which are incorporated herein by reference.

BACKGROUND OF THE INVENTION

1. Field of the Invention

The present invention relates to a method and apparatus for forming a silicon oxide film on a target substrate, such as a silicon wafer.

2. Description of the Related Art

In manufacturing semiconductor devices for constituting semiconductor integrated circuits, a target substrate, such as a semiconductor wafer, is subjected to various processes, such as film formation, oxidation, diffusion, reformation, annealing, and etching. Films of various kinds used in semiconductor devices need to be made thinner, as semiconductor devices have become smaller and more highly integrated. Accordingly, a silicon oxide film (typically an $SiO_2$ film) commonly used as an insulating film needs to be made thinner, where the film is formed as a filler or gate insulating film by a film-formation process.

A silicon oxide film may be formed to fill a recess having a high aspect ratio, such as a trench, formed in the surface of a wafer. Where a silicon oxide film used as a filler of this kind is formed, a film-formation method with good step coverage is employed to fully fill the recess. One example of this is a CVD (Chemical Vapor Deposition) process of forming a silicon oxide film, using an Si-containing organic material, such as TOES (Tetra Ethyl Ortho Silicate). Jpn. Pat. Appln. KOKAI Publication No. 2001-77105 discloses a CVD process of this kind.

Figure 8A:
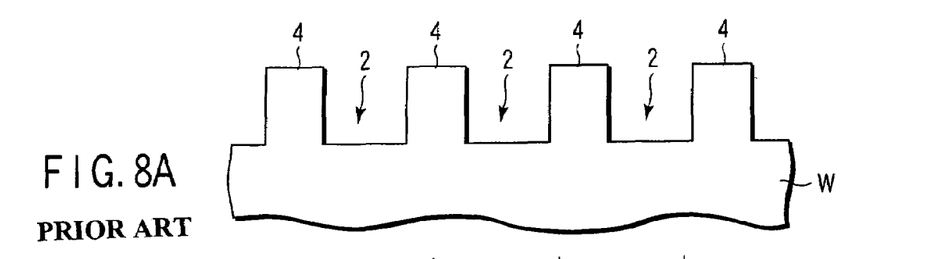
FIGS. 8A to 8C are sectional views showing sequential steps of a conventional CVD process using TOES.
Figure 8B:
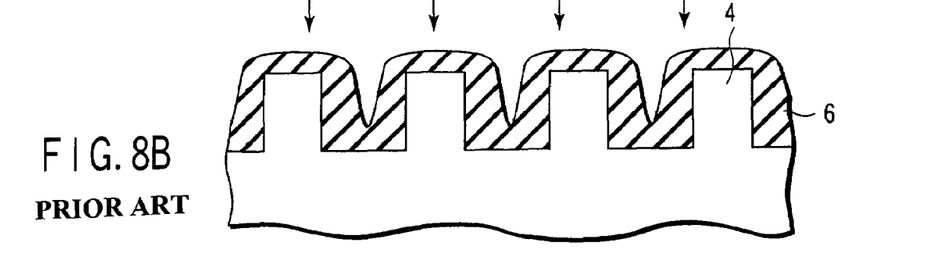
Figure 8C:
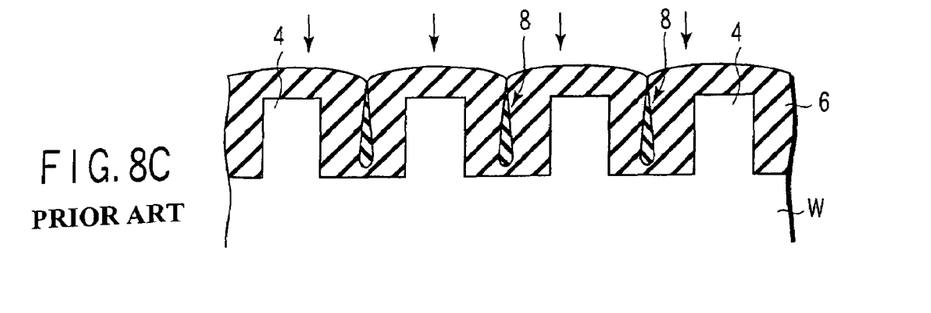

FIGS. 8A to 8C are sectional views showing sequential steps of a conventional CVD process using TOES. As shown in FIG. 8A, recesses 2 and projections 4 are alternately formed at the surface of a target substrate or silicon wafer (semiconductor wafer) W. For example, each recess 2 is a trench for device isolation, while each projection 4 is a device region for forming therein a device, such as a transistor or capacitor. This semiconductor wafer W is subjected to a CVD process using TOES to deposit a silicon oxide film 6 on the entire substrate surface, as shown in FIG. 8B. As shown in FIG. 8C, the silicon oxide film 6 formed by the CVD process entirely fills the recesses 2 and entirely covers the projections 4.

The surface of the silicon oxide film 6 deposited by the CVD process becomes slightly wavy due to reflection of the shape of the recesses 2. A planarizing process, such as CMP (Chemical Mechanical Polishing), is performed, to remove the wavy portions and planarize the surface of the silicon oxide film 6. Then, contact holes are formed in the silicon oxide film 6 to make electrical contacts to the underlying layer. After the contact holes are formed, an etching process (cleaning process) is performed, using an etching solution, such as hydrogen fluoride solution. This is to clean the bottom of the contact holes or the like, to reduce the contact resistance. Then, metal wiring layers are respectively disposed within the contact holes.

BRIEF SUMMARY OF THE INVENTION

An object of the present invention is to provide a method and apparatus which can form a silicon oxide film with good dielectric properties and etching resistance.

According to a first aspect of the present invention, there is provided a method for forming a silicon oxide film, comprising:

disposing a silicon oxide film on a surface of a target substrate; and annealing the silicon oxide film while exposing the silicon oxide film to oxygen radicals and hydroxyl group radicals, thereby performing a reformation process on the silicon oxide film.

According to a second aspect of the present invention, there is provided a method for forming a silicon oxide film, comprising:

setting a process field inside a reaction container, which accommodates a target substrate, at a first temperature and a first pressure, and supplying a source gas comprising an Si-containing organic material into the process field, thereby depositing a silicon oxide film on a surface of the target substrate by CVD; and subsequently to deposition of the silicon oxide film, setting the process field at a second temperature of 400 to 1000° C. and a second pressure of 133 Pa or less, and supplying an oxidizing gas and a deoxidizing gas into the process field, thereby reforming the silicon oxide film, using oxygen radicals and hydroxyl group radicals derived from the oxidizing gas and the deoxidizing gas.

According to a third aspect of the present invention, there is provided an apparatus for forming a silicon oxide film, comprising:

a reaction container having a process field to accommodate a target substrate;

a heater configured to heat the process field;

an exhaust system configured to exhaust the reaction container;

a source gas supply circuit configured to supply a source gas into the reaction container, the source gas comprising an Si-containing organic material for depositing a silicon oxide film;

an oxidizing gas supply circuit configured to supply an oxidizing gas for reforming the silicon oxide film, into the process container; and a deoxidizing gas supply circuit configured to supply a deoxidizing gas for reforming the silicon oxide film, into the process container.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the process of developing the present invention, the inventor studied problems related to the conventional method for forming a silicon oxide film shown in FIGS. 8A to 8C. As a result, the inventor has arrived at the findings given below.

As shown in FIG. 8C, the center of a portion of the silicon oxide film 6 filling each recess 2 contains a structure wherein two surfaces of a growing silicon oxide film have come into contact with each other. As a consequence, a linear seam 8 is formed in the silicon oxide film 6 at the center of each recess 2. The seam 8 tends to contain organic substances produced by decomposition of TOES and etching solution components having penetrated therein. The seam 8 thus formed may deteriorate properties of the insulating film, or cause short-circuiting of contact lines.

Particularly, where the recesses 2 are trenches for device isolation, the aspect ratio of each recess 2 is becoming higher in recent years, as semiconductor devices are more highly integrated. This means that the seam 8 are easily formed, and thus requires a technique to reliably prevent the seam 8 from being formed.

Further, the body of the silicon oxide film other than the seam 8 contains traces of organic components produced by decomposition of TOES. As a consequence, the etching resistance of the silicon oxide film 6 becomes very low, and a large volume of the film is therefore removed by etching. This problem can be solved to some extent by reforming the silicon oxide film with water vapor, as shown in Jpn. Pat. Appln. KOKAI Publication No. 2001-77105 described above, but this is not satisfactory.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
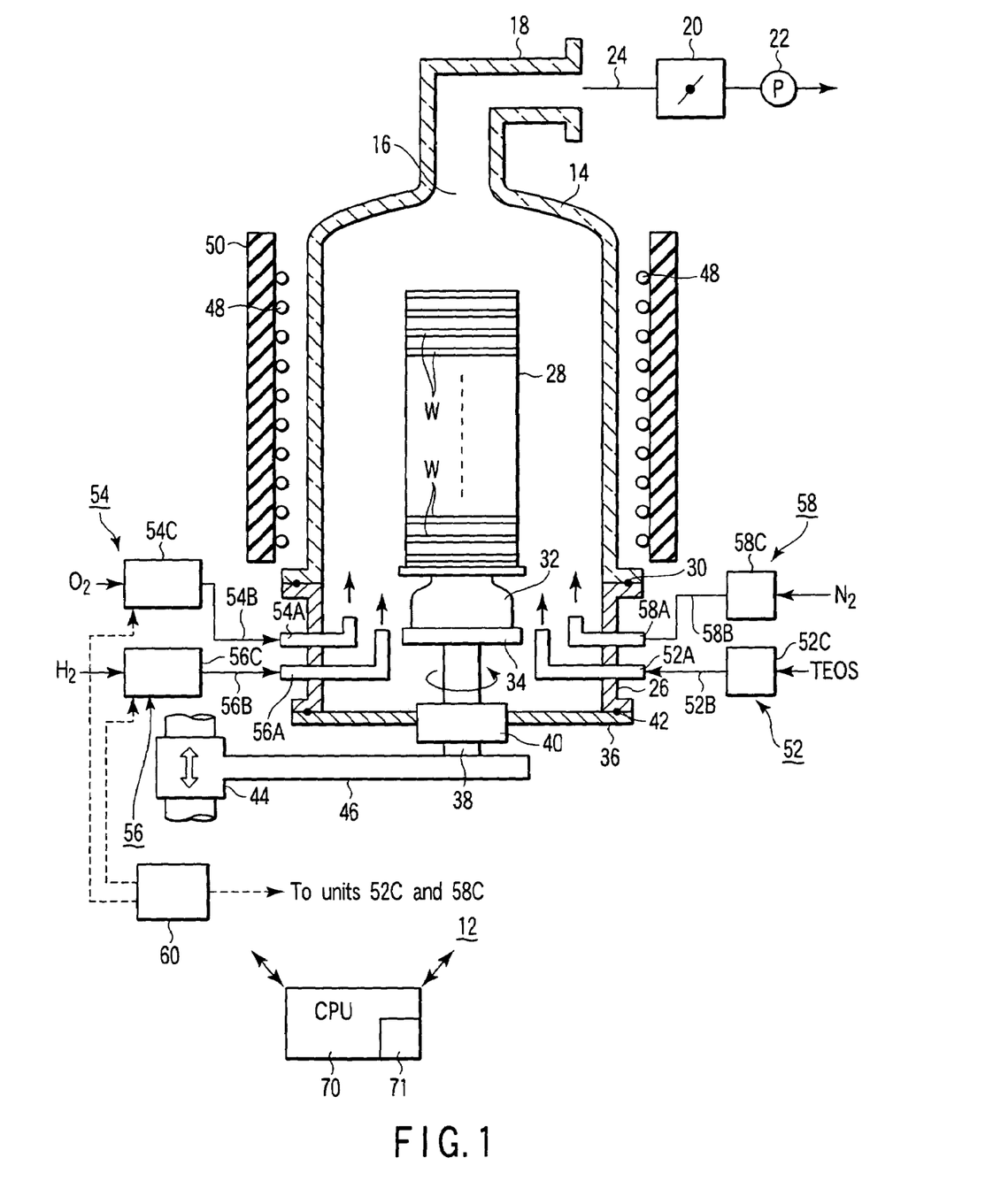
FIG. 1 is a structural view showing a film-formation apparatus according to an embodiment of the present invention.

FIG. 1 is a structural view showing a film-formation apparatus according to an embodiment of the present invention. As shown in FIG. 1, the film-formation apparatus (CVD apparatus) 12 includes a vertical, process container 14, which is cylindrical and opened at the bottom. The process container 14 is made of, e.g., quartz, which is high in heat resistance. An exhaust port 16 is formed at the top of the process container 14. The exhaust port 16 is connected to, e.g., an exhaust nozzle 18 laterally bent at right angles. The exhaust nozzle 18 is connected to an exhaust system 24 including a pressure control valve 20 and a vacuum pump 22, provided thereon. The interior of the process container 14 is vacuum-exhausted by the exhaust section 24.

The bottom of the process container 14 is supported by a cylindrical manifold 26 made of, e.g., stainless steel. A sealing member 30, such as an O-ring, is interposed between the bottom of the process container 14 and manifold 26 to keep this portion airtight. The manifold 26 has a port at the bottom, through which a wafer boat 28 is loaded and unloaded. The wafer boat 28 is made of quartz, and functions as holding means for holding semiconductor wafers W at intervals in the vertical direction. In this embodiment, the wafer boat 28 can support, e.g., 50 wafers W each having a diameter of 300 mm, essentially at regular intervals in the vertical direction.

The wafer boat 28 is placed on a table 34 through a heat-insulating cylinder 32 made of quartz. The table 34 is supported on the top of a rotary shaft 38, which penetrates a lid 36 used for opening/closing the bottom port of the manifold 26. The portion of the lid 36 where the rotary shaft 38 penetrates is provided with, e.g., a magnetic-fluid seal 40, so that the rotary shaft 38 is rotatably supported in an airtightly sealed state. A seal member 42, such as an O-ring, is interposed between the periphery of the lid 36 and the bottom of the manifold 26, so that the interior of the process chamber 14 can be kept sealed.

The rotary shaft 38 is attached at the distal end of an arm 46 supported by an elevating mechanism 44, such as a boat elevator. The elevating mechanism 44 moves the wafer boat 28 and lid 36 up and down integratedly. The table 34 may be fixed to the lid 36, so that the wafer boat 28 is not rotated in processing wafers W.

A heater 48 formed of carbon wires (for example, see Jpn. Pat. Appln. KOKAI Publication No. 2003-209063) is disposed to surround the process container 14. The heater 48 is arranged to heat the atmosphere within the process container 14 so as to heat up the semiconductor wafers W. The carbon wire heater is suitable a case where processes are serially performed, as described later, because it can realize a clean process and has good characteristics for increasing and decreasing the temperature. The heater 48 is surrounded by a thermal insulator 50 to ensure thermal stability. The manifold 26 is connected to several gas supply circuits to supply various gases into the process container 14.

More specifically, the manifold 26 is connected to a source gas supply circuit 52, oxidizing gas supply circuit 54, deoxidizing gas supply circuit 56, and inactive gas supply circuit 58. The source gas supply circuit 52 is arranged to supply a source gas for film-formation into the process container 14. The oxidizing gas supply circuit 54 is arranged to supply an oxidizing gas into the process container 14. The deoxidizing gas supply circuit 56 is arranged to supply a deoxidizing gas into the process container 14. The inactive gas supply circuit 58 is arranged to supply an inactive gas, such as nitrogen ($N_2$), into the process container 14. In this embodiment, the source gas is TOES gas, which is an organic material containing Si. The oxidizing gas is oxygen ($O_2$) gas, and the deoxidizing gas is ($H_2$) gas. In place of nitrogen, Ar or He may be used as the inactive gas.

The gas supply circuits 52, 54, 56, and 58 have gas nozzles 52A, 54A, 56A, and 58A, respectively. Each of the gas nozzles 52A, 54A, 56A, and 58A penetrates the sidewall of the manifold 26 and is bent at right angles to direct the distal end upward. The gas nozzles 52A, 54A, 56A, and 58A are connected to gas lines 52B, 54B, 56B, and 58B provided with gas control units 52C, 54C, 56C, and 58C, respectively, each of which is formed of a flow rate controller, such as a mass flow controller, and a switching valve. The gas control units 52C, 54C, 56C, and 58C are operated by a gas supply controller 60, such as a microcomputer, to control the supply, stop, and flow rates of the gases.

Next, an explanation will be given of a film-formation method according to an embodiment of the present invention, performed in the film-formation apparatus 12 described above. The method according to this embodiment is characterized in that a silicon oxide film is disposed on the surface of a target substrate, and is then reformed by annealing while it is exposed to oxygen radicals and hydroxyl group radicals. In this embodiment, the silicon oxide film is formed by a CVD process within the process container 14, and then the silicon oxide film is sequentially subjected to a reformation process within the same process container 14.

The method described below (including the supply and stop of the gases) may be performed under the control of a CPU 70, which controls the entire apparatus, in accordance with the process recipe of CVD processes about, e.g., the film thickness and composition of a film to be formed, stored in the memory 71 thereof in advance. In the memory 71, the relationship between the process gas flow rates and the thickness and composition of the film is also stored as control data in advance. Accordingly, the CPU 70 can control the gas supply circuits, exhaust section 24, and heater 48, based on the stored process recipe and control data.

At first, when the film-formation apparatus 12 is in a waiting state with no wafers loaded therein, the interior of the process container 14 is kept at a temperature lower than a process temperature. On the other hand, a number of wafers W, e.g. 50 wafers, are transferred into the wafer boat 28 at a normal temperature, which is then moved up from below into the process container 14. Then, the bottom port of the manifold 26 is closed by the lid 36 to airtightly seal the interior of the process container 14.

Then, the interior of the process container 14 is vacuum-exhausted and kept at a predetermined process pressure. At the same time, the power supplied to the heater 48 is increased, so that the wafer temperature is raised and stabilized at a process temperature for film-formation. Then, predetermined process gases necessary for each process step are supplied from the respective gas nozzles 52A, 54A, and 56A of the gas supply circuits 52, 54, and 56 at controlled flow rates, into the process container 14.

The process gases flow upward in the process container 14 and come into contact with the wafers W supported in the wafer boat 28, which is rotating, so as to perform a predetermined film-formation process on the wafer surfaces. The process gases thus used and gases produced by reaction are exhausted out of the apparatus through the exhaust port 16 at the top of the process container 14. In this method, the gases being used are sequentially switched to sequentially perform a CVD process and a reformation process, as described above.

Figure 2A:
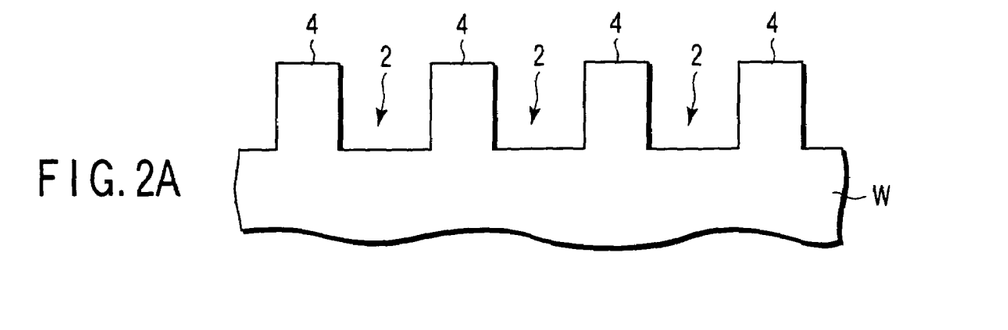
FIGS. 2A to 2D are sectional views showing sequential steps of a method of forming a silicon oxide film, according to an embodiment of the present invention.

FIGS. 2A to 2D are sectional views showing sequential steps of a method of forming a silicon oxide film, according to an embodiment of the present invention. As shown in FIG. 2A, recesses 2 and projections 4 are alternately formed at the surface of a target substrate or silicon wafer (semiconductor wafer) W. For example, each recess 2 is a trench for device isolation, while each projection 4 is a device region for forming therein a device, such as a transistor or capacitor.

Figure 2B:
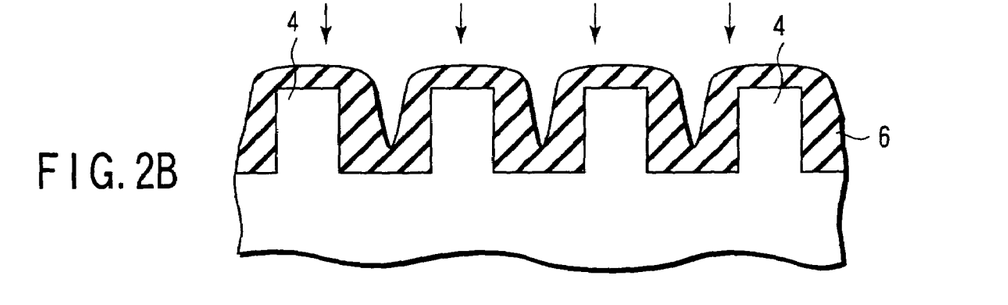
Figure 2C:
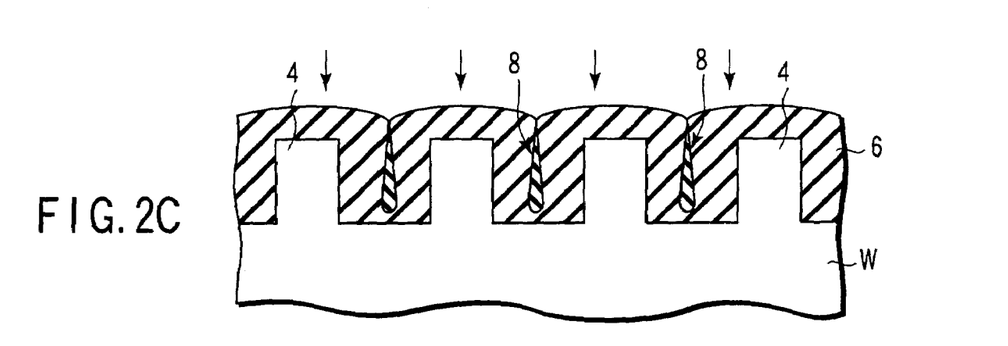

This semiconductor wafer W is first subjected to a step of disposing a silicon oxide film. Specifically, TOES gas is supplied through the source gas supply circuit 52 into the process container 14, and oxygen ($O_2$) gas is supplied through the oxidizing gas supply circuit 54 into the process container 14. Si components obtained by thermal decomposition of TOES react with oxygen, and produce silicon oxide, which is deposited (CVD) on the wafer W and thereby forms a silicon oxide film 6 on the wafer W. FIG. 2B shows a state during deposition of the silicon oxide film 6, and FIG. 2C is a state where deposition of the silicon oxide film 6 is completed. No hydrogen ($H_2$) gas is supplied during the CVD step of the silicon oxide film.

In the CVD step of the silicon oxide film, the process temperature is set to be within a range of from 550 to 750° C., such as about 680° C., and the process pressure to be within a range of from 30 to 266 Pa, such as about 133 Pa. The flow rate of TOES gas is set to be within a range of from 100 to 400 sccm, such as about 200 sccm, and the flow rate of oxygen ($O_2$) gas to be within a range of from 10 to 500 sccm, such as about 100 sccm.

As shown in FIG. 2C, the silicon oxide film 6 formed by the CVD process entirely fills the recesses 2 and entirely covers the projections 4. At this time, the center of a portion of the silicon oxide film 6 filling each recess 2 contains a structure wherein two surfaces of a growing silicon oxide film have come into contact with each other. As a consequence, a linear seam 8 is formed in the silicon oxide film 6 at the center of each recess 2. The seam 8 tends to contain organic substances produced by decomposition of TOES and etching solution components having penetrated therein. The seam 8 thus formed may deteriorate properties of the insulating film, or cause short-circuiting of contact lines.

Figure 2D:
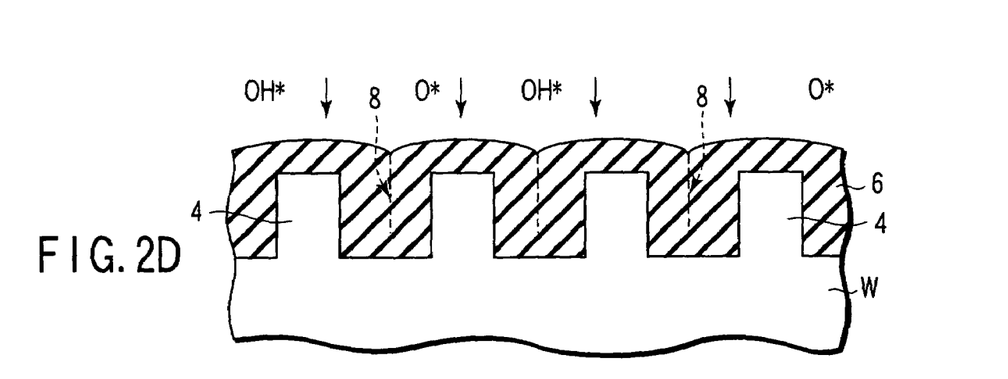

In order to prevent this problem, after the CVD step of the silicon oxide film, the silicon oxide film is subjected to a reformation step, as shown in FIG. 2D. In the reformation step, TOES is not supplied, but oxygen ($O_2$) gas and hydrogen ($H_2$) gas are supplied separately from the nozzles 54A and 56A of the oxidizing gas supply circuit 54 and deoxidizing gas supply circuit 56 into the process container 14. The oxygen gas and hydrogen gas thus supplied react with each other in the process container 14, and thereby generate O* (oxygen radicals) and OH* (hydroxyl group radicals). The radicals act on the silicon oxide film 6 to perform a reformation process thereon. As a consequence, as shown in FIG. 2D, the seams 8 (see FIG. 2C) disappear, and the silicon oxide film 6 improves in etching resistance, as described later. In FIG. 2D, the seams 8 thus vanished are showed with broken lines.

In the reformation step of the silicon oxide film, the flow rate of hydrogen ($H_2$) gas is set to be within a range of from 100 to 5000 sccm, such as about 270 sccm, and the flow rate of oxygen ($O_2$) gas to be within a range of from 100 to 5000 sccm, such as about 2400 sccm. The concentration of hydrogen gas is preferably set to be 40% or less of the total gas supply amount. The process temperature is set to be 400°

C. or more, such as within a range of from 400 to 1000° C., and preferably to be within a range of from 800 to 1000° C. in consideration of the heat resistance or the like of the underlying device. The process pressure is set to be 133 Pa (1 Torr) or less. Where the CVD step and reformation step of the silicon oxide film are performed in the same process temperature, the time necessary for increasing and decreasing the wafer temperature can be excluded.

Specifically, oxygen gas and hydrogen gas separately supplied into the process container 14 cause a combustion reaction of hydrogen near the wafers W, while they flow upward in the process container 14, which is in a hot wall state. As a consequence, an atmosphere mainly containing oxygen radicals and hydroxyl group radicals is formed around the wafers W. The radicals act on the silicon oxide film 6 and reform it by removing organic components therefrom.

The formation process of the radicals is thought to proceed, as follows. Specifically, hydrogen and oxygen separately supplied into the process container 14 under a vacuum atmosphere cause a combustion reaction of hydrogen shown below, closely around each wafer W. In the following formulas, chemical signs with the symbol "*" denote their radicals.

$$H_2+O_2 \rightarrow H^*+HO_2$$

$$O_2+H^* \rightarrow OH^*+O^*$$

$$H_2+O^* \rightarrow H^*+OH^*$$

$$H_2+OH^* \rightarrow H^*+H_2O$$

As shown above, O* (oxygen radicals), OH* (hydroxyl group radicals), and $H_2O$ (water vapor) are generated in the process of a combustion reaction of hydrogen caused by oxygen gas and hydrogen gas, which are separately supplied into the process container 14. The radicals act on the silicon oxide film 6 on the wafers and reform it by removing organic components therefrom. Particularly, it is thought that O* and OH* radicals are the major contributors in this reformation.

The reformation step is performed in a vacuum atmosphere slightly lower in process pressure than the CVD step of the silicon oxide film. Since oxygen gas and hydrogen gas gradually proceed with the reaction in accordance with the series of chemical reaction formulas shown above, while they flow upward in the process container 14, O* and OH* are present in neither too great nor too little quantities around the wafers W at the respective positions in the vertical direction. Accordingly, the wafers W at the respective positions are essentially uniformly reformed, and the inter-substrate uniformity of the reformation process therefore improves. In other words, as described above, where the process pressure is set to be very low, such as 133 Pa or less, the lifetime of oxygen radicals and hydroxyl group radicals is prolonged. In this case, the radicals do not considerably disappear while they are flowing upward in the process container 14, and the inter-substrate uniformity of the reformation process therefore improves.

[Experiment 1]

In a present example 1, a silicon oxide film was formed by a CVD step and a reformation step under the process conditions described in the embodiment. In a comparative example 1, a silicon oxide film was formed by a CVD step under the same process conditions as the present example 1 (without performing the reformation step). The silicon oxide films obtained by the present example 1 and comparative example 1 were subjected to a wet etching under the same conditions. This etching process was performed for 60 seconds at a temperature of 23° C., using 0.5% HF solution as an etching solution.

As a result of their comparison, the silicon oxide film obtained by the present example 1 showed an etching rate of about 70% of that of the comparative example 1. Accordingly, it has been confirmed that the method according to the embodiment remarkably improves the etching resistance of a silicon oxide film.

[Experiment 2]

In a present example 2 and a comparative example 2, silicon wafers were prepared to have recesses 2 and projections 4 alternately formed thereon, as shown in FIG. 2A, and a silicon oxide film 6 was formed to fill the recesses 2. In the present example 2, the silicon oxide film was formed by a CVD step and a reformation step under the process conditions described in the embodiment. In the comparative example 2, the silicon oxide film was formed by a CVD step under the same process conditions as the present example 2 (without performing the reformation step).

Figure 3A:
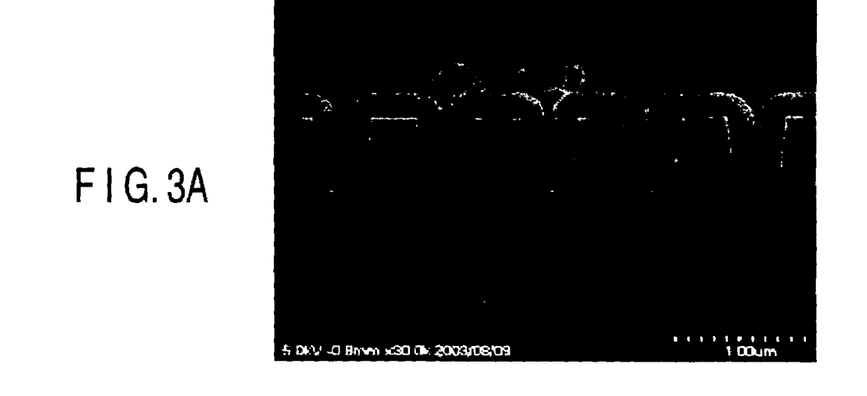
FIGS. 3A and 3B are a microscope photograph and a schematic diagram thereof, respectively, showing the cross section of a surface portion of a wafer according to a comparative example 2.
Figure 3B:
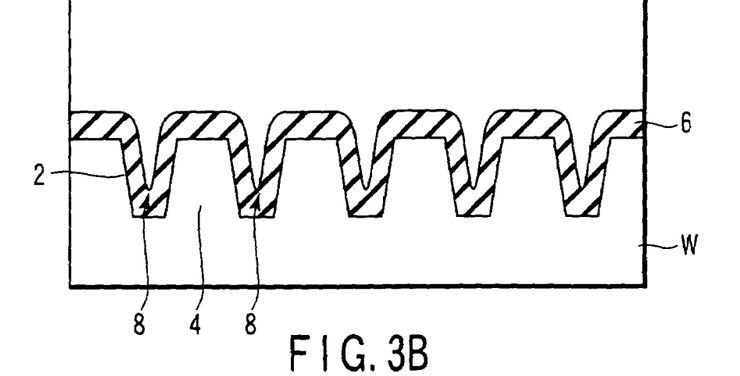
Figure 4A:
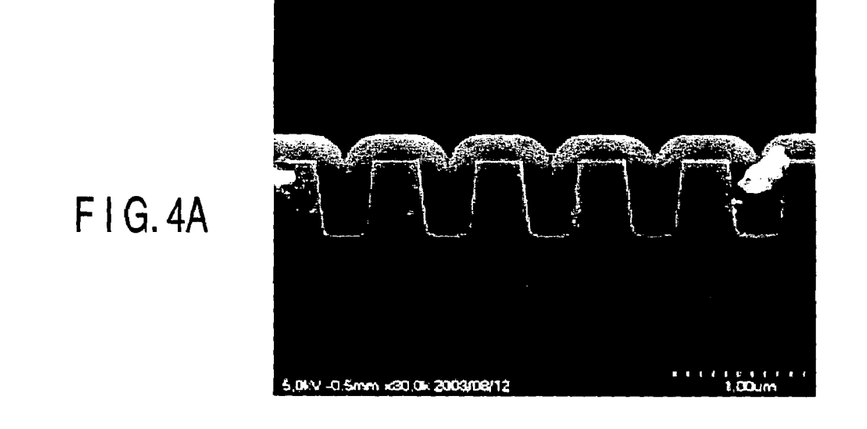
FIGS. 4A and 4B are a microscope photograph and a schematic diagram thereof, respectively, showing the cross section of a surface portion of a wafer according to a present example 2.
Figure 4B:
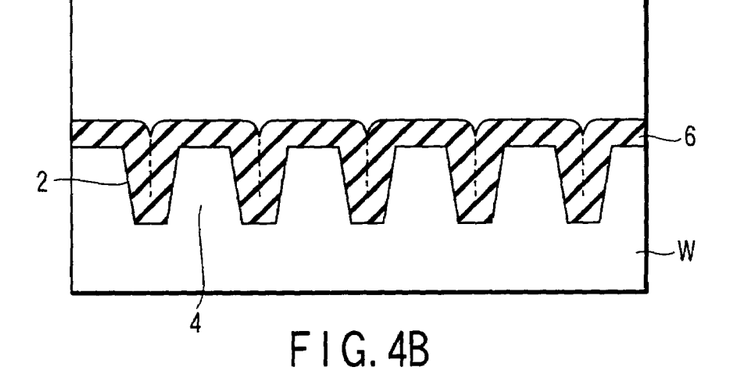

FIGS. 3A and 3B are a microscope photograph and a schematic diagram thereof, respectively, showing the cross section of a surface portion of a wafer according to the comparative example 2. FIGS. 4A and 4B are a microscope photograph and a schematic diagram thereof, respectively, showing the cross section of a surface portion of a wafer according to the present example 2. As shown in FIGS. 3A and 3B, at the surface portion of a wafer obtained by the comparative example 2, a seam 8 was observed in the silicon oxide film 6 within each recess 2. On the other hand, as shown in FIGS. 4A and 4B, at the surface portion of a wafer obtained by the present example 2, no seam 8 was observed in the silicon oxide film 6 within each recess 2. Accordingly, it has been confirmed that the method according to the embodiment can remove a seam formed in a silicon oxide film within each recess 2.

[Experiment 3]

Silicon oxide films were obtained in accordance with the present example 2 and comparative example 2, and were subjected to a wet etching under the same conditions. This etching process was performed for 60 seconds at a temperature of 23° C., using 0.5% HF solution as an etching solution.

Figure 5A:
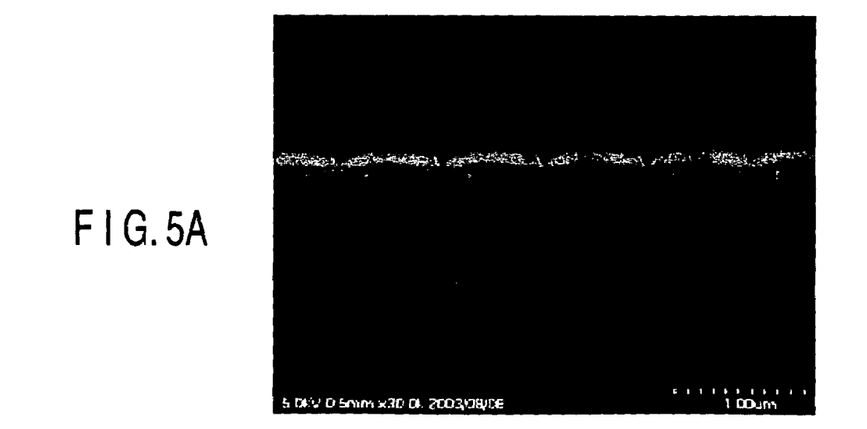
FIGS. 5A and 5B are a microscope photograph and a schematic diagram thereof, respectively, showing the cross section of a surface portion of a silicon wafer before etching, which is used as a reference for estimating etching resistance.
Figure 5B:
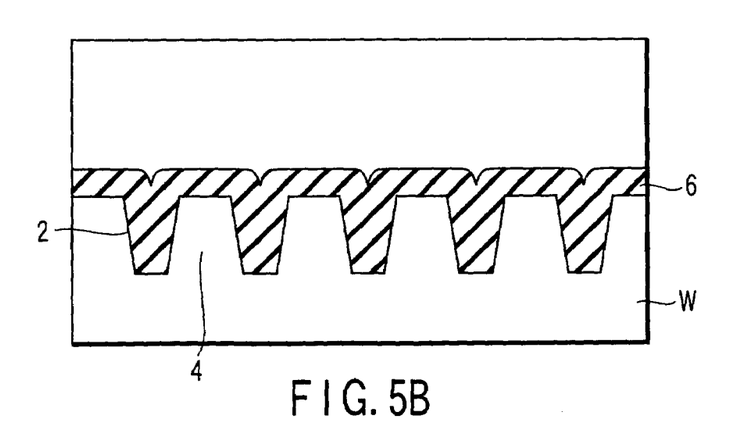
Figure 6A:
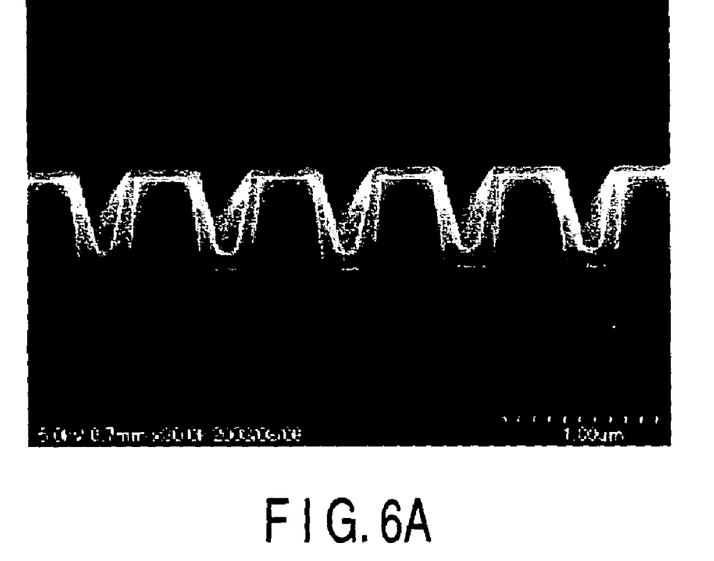
FIGS. 6A and 6B are a microscope photograph and a schematic diagram thereof, respectively, showing the cross section of a surface portion of a wafer according to the comparative example 2 after etching.
Figure 6B:
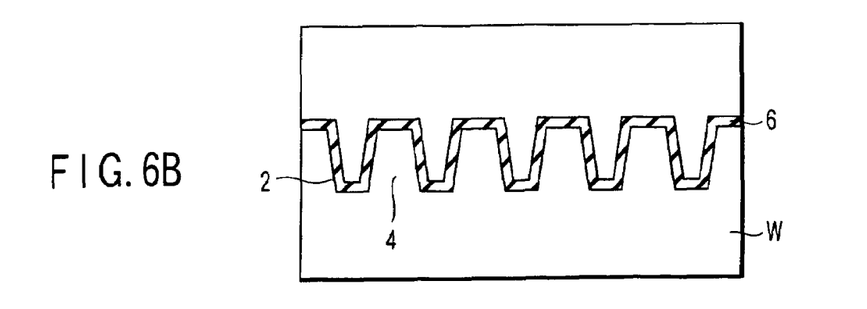
Figure 7A:
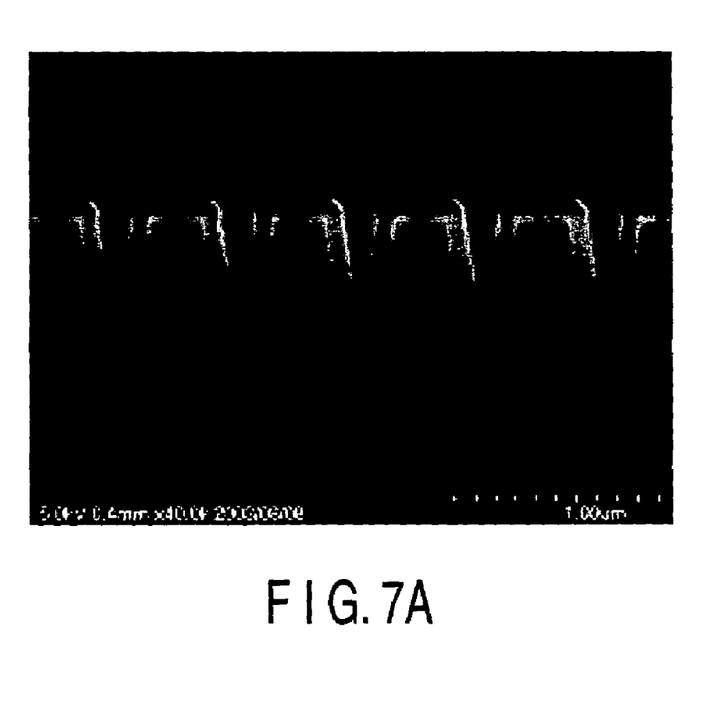
FIGS. 7A and 7B are a microscope photograph and a schematic diagram thereof, respectively, showing the cross section of a surface portion of a wafer according to the present example 2 after etching.
Figure 7B:
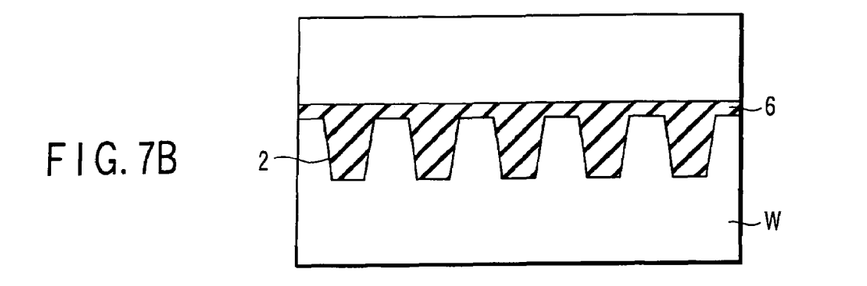

FIGS. 5A and 5B are a microscope photograph and a schematic diagram thereof, respectively, showing the cross section of a surface portion of a silicon wafer before etching, which is used as a reference for estimating etching resistance. FIGS. 6A and 6B are a microscope photograph and a schematic diagram thereof, respectively, showing the cross section of a surface portion of a wafer according to the comparative example 2 after etching. FIGS. 7A and 7B are a microscope photograph and a schematic diagram thereof, respectively, showing the cross section of a surface portion of a wafer according to the present example 2 after etching.

As shown in FIGS. 6A and 6B, the silicon oxide film obtained by the comparative example 2 was remarkably etched by the etching process, i.e., with a large etching amount. On the other hand, as shown in FIGS. 7A and 7B, the silicon oxide film obtained by the present example 2 was etched less by the etching process, i.e., with a small etching amount. Accordingly, it has been confirmed that the method according to the embodiment remarkably improves the etching resistance of a silicon oxide film.

[Experiment 4]

In this experiment, the process pressure and process temperature of the reformation step were used as parameters to examine them.

As regards the process pressure, where it was higher than 133 Pa, the inter-substrate uniformity of the reformation process in the vertical direction of the process container 14 was out of the acceptable range. This is thought to have occurred because the concentration of oxygen radicals and hydroxyl group radicals greatly differed, depending on the position. As regards the process temperature, where it was lower than 400° C., the radicals described above were not generated, so the reformation process itself could not take place.

In the embodiment described above, TOES gas is used as the source gas to form a silicon oxide film on a substrate by CVD. Alternatively, another organic material containing Si, such as a material for SOG (Spin On Glass), may be used to form a silicon oxide film on a substrate. Further, a material containing Si other than organic materials, such as a silane family gas, may be used to form a CVD oxide film at a high temperature (HTO: High Temperature Oxide), thereby forming a silicon oxide film on a substrate.

In the embodiment described above, oxygen ($O_2$) gas is used as the oxidizing gas, and hydrogen ($H_2$) gas is used as the deoxidizing gas. Alternatively, one or more gases selected from the group consisting of $O_2$, $N_2O$, NO, and $NO_2$ may be used as the oxidizing gas. In any case, as described above, oxygen radicals and hydroxyl group radicals generated in the process of combustion of the deoxidizing gas are main substances to contribute to the reformation reaction of a wafer surface. Where gases other than oxygen and hydrogen are used, as described above, the process conditions, such as wafer temperature and process pressure, may be set almost the same as those for oxygen and hydrogen.

In the embodiment described above, a silicon oxide film is an insulating film used as a filler for filling recesses on a wafer surface. Alternatively, a silicon oxide film may be used as a gate insulating film or capacitor insulating film.

Furthermore, in the embodiment described above, the film-formation apparatus is exemplified by a vertical film-formation apparatus of the batch type with a single-tube reaction container. Alternatively, the present invention may be applied to a vertical film-formation apparatus of the batch type with a double-tube reaction container, or to a film-formation apparatus of the single-substrate type for processing wafers one by one. A film to be formed is not limited to a capacitor electrode, and the present invention may be applied to a gate electrode or barrier layer. A target substrate is not limited to a semiconductor wafer, and the present invention may be applied to a LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a silicon oxide film simultaneously on a plurality of target substrates stacked at intervals in a vertical direction within a process field inside a reaction container, to fill a recess present at a surface of the target substrates with the silicon oxide film, the method comprising:

depositing a silicon oxide film on the surface of the target substrates by thermal CVD, while setting the process field at a first temperature and a first pressure, and supplying a source gas comprising an Si-containing organic material and a first oxidizing gas into the process field; and reforming the silicon oxide film by oxygen radicals and hydroxyl group radicals within the process field, while setting the process field at a second temperature and a second pressure, wherein the depositing deposits the silicon oxide film to have a thickness such that the silicon oxide film is bent inside the recess and surfaces of adjacent portions of the silicon oxide film come into contact with each other, whereby a seam containing an organic substance produced by decomposition of the source gas is formed in the silicon oxide film within the recess, the reforming uses process conditions, including the second temperature set to be 400 to 1000° C. and the second pressure set to be 133 Pa or less, to remove the organic substance from the seam in the silicon oxide film and to make the seam disappear, and the reforming supplies a second oxidizing gas and a deoxidizing gas into the process field, and causing a combustion reaction of the deoxidizing gas with the second oxidizing gas to generate the oxygen radicals and the hydroxyl group radicals.

2. The method according to claim 1, wherein each of the and second oxidizing gases comprises one or more gases selected from the group consisting of $O_2$, $N_2O$, NO, and $NO_2$ gases, and the deoxidizing gas comprises $H_2$ gas.

3. The method according to claim 1, wherein each of the and second oxidizing gases comprises oxygen gas and the deoxidizing gas comprises hydrogen gas.

4. The method according to claim 1, wherein the reaction container has an exhaust port at a top, and the second oxidizing gas and the deoxidizing gas are supplied from below the process field.

5. The method according to claim 1, wherein the recess is a trench for device isolation.

6. The method according to claim 1, wherein the source gas comprises TOES (Tetra Ethyl Ortho Silicate) gas.

7. The method according to claim 6, wherein the first temperature is set to be 550 to 750° C., and the first pressure is set to be 30 to 266 Pa.

8. The method according to claim 7, wherein the second temperature is set to be 800 to 1000° C.

9. The method according to claim 7, wherein the first and second temperatures are substantially the same.

10. A method for forming a silicon oxide film simultaneously on a plurality of target substrates stacked at intervals in a vertical direction within a process field inside a reaction container, to fill a trench for device isolation present at a surface of the target substrates with the silicon oxide film, the method comprising:

depositing a silicon oxide film on the surface of the target substrates by thermal CVD, while setting the process field at a first temperature and a first pressure, and supplying TOES (Tetra Ethyl Ortho Silicate) gas and first oxygen gas into the process field; and reforming the silicon oxide film by oxygen radicals and hydroxyl group radicals within the process field, while setting the process field at a second temperature and a second pressure, wherein the depositing uses process conditions, including the first temperature set to be 550 to 750° C. and the first pressure set to be 30 to 266 Pa, to deposit the silicon oxide film to have a thickness such that the silicon oxide film is bent inside the trench and surfaces of adjacent portions of the silicon oxide film come into contact with each other, whereby a seam containing an organic substance produced by decomposition of the source gas is formed in the silicon oxide film within the trench, the reforming uses process conditions, including the second temperature set to be 400 to 1000° C., and the second pressure set to be 133 Pa or less, to remove the organic substance from the seam in the silicon oxide film and to make the seam disappear, and the reforming supplies second oxygen gas and hydrogen gas into the process field, and causing a combustion reaction of the hydrogen gas with the second oxygen gas to generate the oxygen radicals and the hydroxyl group radicals.

11. The method according to claim 10, wherein the reaction container has an exhaust port at a top, and the second oxygen gas and the hydrogen gas are supplied from below the process field.

* * * * *